(12) United States Patent
Im et al.

(10) Patent No.: US 9,196,667 B2
(45) Date of Patent: Nov. 24, 2015

(54) ORGANIC LIGHT-EMITTING DISPLAY WITH VERTICALLY STACKED CAPACITOR AND CAPACITIVE FEEDBACK

(71) Applicant: Samsung Display Co., Ltd., Yongin, Gyeonggi-Do (KR)

(72) Inventors: Ki-Ju Im, Yongin (KR); Chaun-Gi Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 133 days.

(21) Appl. No.: 14/026,828

(22) Filed: Sep. 13, 2013

(65) Prior Publication Data

US 2014/0151652 A1    Jun. 5, 2014

(30) Foreign Application Priority Data

Dec. 4, 2012 (KR) ......................... 10-2012-0139821

(51) Int. Cl.
*H01L 27/32* (2006.01)
*H01L 51/52* (2006.01)

(52) U.S. Cl.
CPC ........ *H01L 27/3279* (2013.01); *H01L 51/5228* (2013.01); *H01L 27/3262* (2013.01); *H01L 27/3265* (2013.01); *H01L 2251/5315* (2013.01)

(58) Field of Classification Search
CPC ............ H01L 27/3279; H01L 27/3265; H01L 27/3262; H01L 51/5228; H01L 2251/5315
USPC ................ 257/40, E27.131; 438/34
See application file for complete search history.

(56) References Cited

U.S. PATENT DOCUMENTS

| | | | |
|---|---|---|---|
| 6,900,470 B2 | 5/2005 | Kobayashi et al. | |
| 7,224,115 B2 | 5/2007 | Sato et al. | |
| 7,928,431 B2 | 4/2011 | Choe et al. | |
| 7,994,710 B2 | 8/2011 | Jeon et al. | |
| 2008/0142807 A1 | 6/2008 | Choe et al. | |
| 2009/0179831 A1* | 7/2009 | Yamashita et al. | 345/76 |
| 2009/0200544 A1 | 8/2009 | Lee et al. | |
| 2009/0200921 A1 | 8/2009 | Lee et al. | |
| 2009/0200922 A1 | 8/2009 | Lee et al. | |
| 2010/0102311 A1* | 4/2010 | Ito et al. | 257/43 |
| 2010/0193790 A1* | 8/2010 | Yeo et al. | 257/59 |
| 2011/0108840 A1* | 5/2011 | Lee et al. | 257/59 |
| 2011/0108848 A1* | 5/2011 | Lee et al. | 257/72 |
| 2012/0171794 A1* | 7/2012 | Yang et al. | 438/34 |
| 2012/0292612 A1* | 11/2012 | Jeong et al. | 257/43 |

FOREIGN PATENT DOCUMENTS

| | | |
|---|---|---|
| JP | 4517304 B2 | 5/2010 |
| JP | 4725054 B2 | 4/2011 |
| JP | 2011-221203 A | 11/2011 |

* cited by examiner

*Primary Examiner* — Stephen W Smoot
*Assistant Examiner* — Pavel Ivanov
(74) *Attorney, Agent, or Firm* — Robert E. Bushnell, Esq.

(57) ABSTRACT

An organic light-emitting display device includes a first electrode disposed on a substrate; a plurality of insulating layers which are sequentially disposed on the first electrode, and on which a contact hole for exposing a part of a surface of the first electrode is formed; and an organic light-emitting diode which includes a pixel electrode disposed on the plurality of insulating layers, a second electrode facing the pixel electrode and contacting the first electrode through the contact hole, and an organic emissive layer disposed between the pixel electrode and the second electrode.

14 Claims, 9 Drawing Sheets

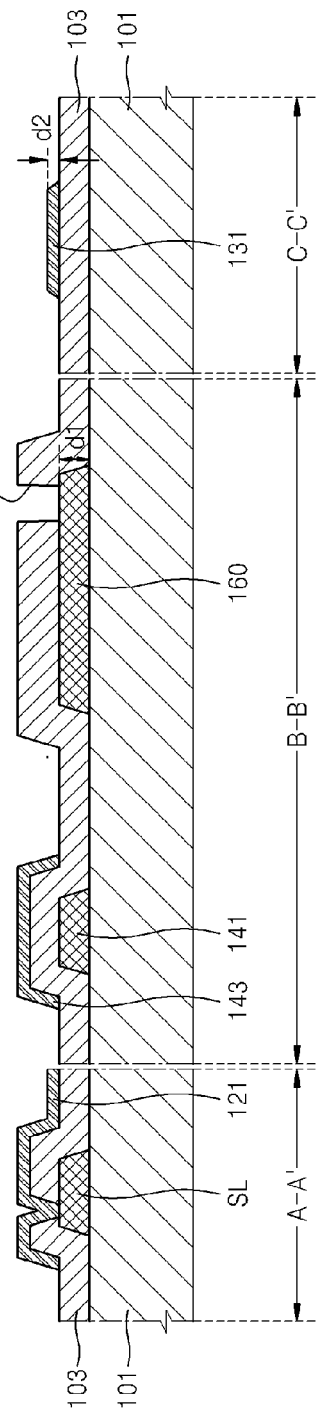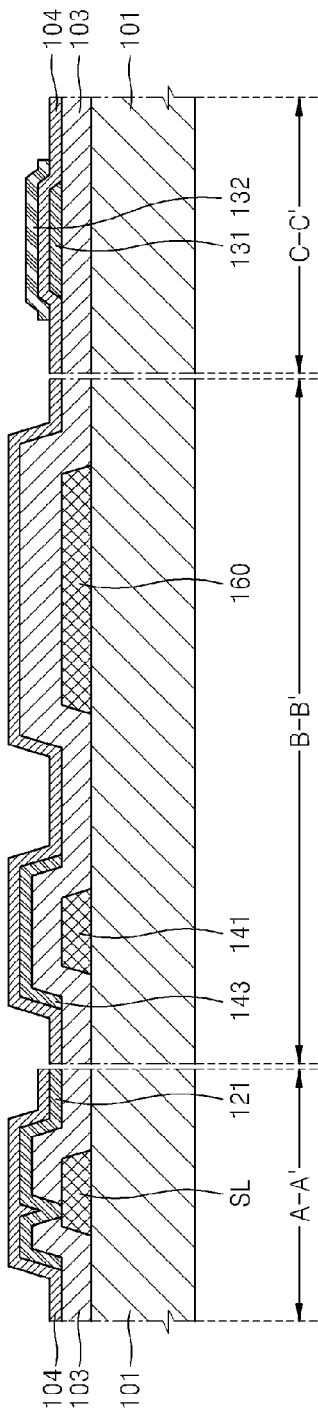

ORGANIC LIGHT-EMITTING DISPLAY WITH VERTICALLY STACKED CAPACITOR AND CAPACITIVE FEEDBACK

CLAIM OF PRIORITY

This application makes reference to, incorporates into this specification the entire contents of, and claims all benefits accruing under 35 U.S.C. §119 from an application earlier filed in the Korean Intellectual Property Office filed on Dec. 4, 2012 and there duly assigned Ser. No. 10-2012-0139821.

BACKGROUND OF THE INVENTION

1. Field of the Invention

The present invention relates to an organic light-emitting display device, and more particularly to an organic light-emitting display device characterized by improved brightness and reduced power consumption.

2. Description of the Related Art

An organic light-emitting display device is a self-emission display for displaying an image by using an organic light-emitting diode (OLED). Light is emitted by energy that is generated when an exciton drops from an excitation state to a ground state within an organic emissive layer where the organic light-emitting display device displays an image.

The organic light-emitting display device may be classified into a bottom-emission type and a top-emission type. The organic light-emitting display device forms cathode electrodes as common electrodes on entire pixel areas. In the case of the bottom-emission type, the cathode electrodes function as a reflective layer. Accordingly, the cathode electrodes may be formed of thick and low-resistance material in order to minimize an internal-resistance (IR) drop of the common voltage ELVSS in the cathode electrodes. Meanwhile, with regard to the top-emission type, the cathode electrodes function as a transmissive layer and are formed of thin and transparent materials along with low electrical resistivity in order to increase light transmission. Therefore, a voltage drop increases in the cathode electrodes due to high resistance. Specifically, when a size of the display device increases, a voltage drop in the cathode electrodes increases, which causes unevenness in image quality and characteristics.

Therefore, it is necessary to utilize an advantage of the top-emission type and minimize a voltage drop in the cathode electrodes.

SUMMARY OF THE INVENTION

One or more aspects of the present invention provide an organic light-emitting display device for improving evenness of brightness by minimizing a voltage drop in cathode electrodes and for reducing power consumption by narrowing a driving voltage margin of an organic light-emitting diode (OLED).

According to an aspect of the present invention, there is provided an organic light-emitting display device including first electrodes disposed on a substrate; a plurality of insulating layers which are sequentially disposed on the first electrode and on which a contact hole for exposing a part of a surface of the first electrode is formed; and an organic light-emitting diode (OLED) which includes a pixel electrode disposed on the plurality of insulating layers, a second electrode facing the pixel electrode and contacting the first electrode through the contact hole, and an organic emissive layer disposed between the pixel electrode and the second electrode.

The first electrodes may be formed of the same material and on the same layer as scanning lines.

The first electrodes may overlap with a part of the pixel electrode and contact the second electrode through a contact hole which is formed near the pixel electrode.

The first electrodes may function as an auxiliary wiring of the second electrodes.

The first electrodes may not overlap with a driving circuit unit which is formed on the first electrode, but may partially overlap with the OLED.

The organic light-emitting display device may include gate electrodes disposed on the scanning lines, an active layer on the gate electrodes, and source and drain electrodes which contact source and drain areas of the active layer.

The active layer may be formed of an oxide conductor.

A thickness of the gate electrodes may be less than a thickness of the scanning lines.

The gate electrode may contact the scanning lines through a contact hole which is formed on an insulating layer on the scanning lines.

The organic light-emitting display device may further include a capacitor which includes first capacitor electrodes disposed on the same layer as the scanning lines, second capacitor electrodes disposed on the same layer as the gate electrode, and third capacitor electrodes disposed on the same layer as the source and drain electrodes.

The capacitor may further include fourth capacitor electrodes, which extend from the pixel electrodes, on the third capacitor electrodes.

According to an aspect of the present invention, there is also provided an organic light-emitting display device including scanning lines disposed in one direction on a substrate; first electrodes disposed on the same layer as the scanning lines; a plurality of insulating layers which are sequentially disposed on the first electrodes, and on which a contact hole for exposing a part of a surface of the first electrodes is formed; and second electrodes which are disposed on an uppermost insulating layer among the plurality of insulating layers, and which contact the first electrodes through the contact hole.

The first electrodes may be formed of the same material, and on the same layer, as the scanning lines.

The first electrodes may overlap with a part of the pixel electrodes which are disposed under the uppermost insulating layer, and a part of which is exposed through a hole formed on the uppermost insulating layer, and may contact the second electrodes through the contact hole which is formed near the pixel electrodes.

The first electrodes may function as an auxiliary wiring of the second electrodes.

The organic light-emitting display device may include a driving circuit unit which is formed on the first electrodes; and an OLED including pixel electrodes, an organic emissive layer, and the second electrodes which are sequentially formed on the driving circuit unit.

The first electrodes may not overlap with the driving circuit unit, but may partially overlap with the OLED.

The driving circuit unit may include a thin-film transistor (TFT) which includes gate electrodes disposed on the scanning lines, an active layer on the gate electrodes, and source and drain electrodes which contact source and drain areas of the active layer.

The driving circuit unit may include a capacitor which includes first capacitor electrodes disposed on the same layer as the scanning lines, second capacitor electrodes disposed on the same layer as the gate electrode, and third capacitor electrodes disposed on the same layer as the source and drain electrodes.

The capacitor may further include fourth capacitor electrodes, which extend from the pixel electrodes, on the third capacitor electrodes.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2 through 11 are cross-sectional views, taken along lines A-A', B-B', and C-C' of FIG. 1, for explaining a method of manufacturing an organic light-emitting display device according to an embodiment of the present invention.

DETAILED DESCRIPTION OF THE INVENTION

Figure 1:
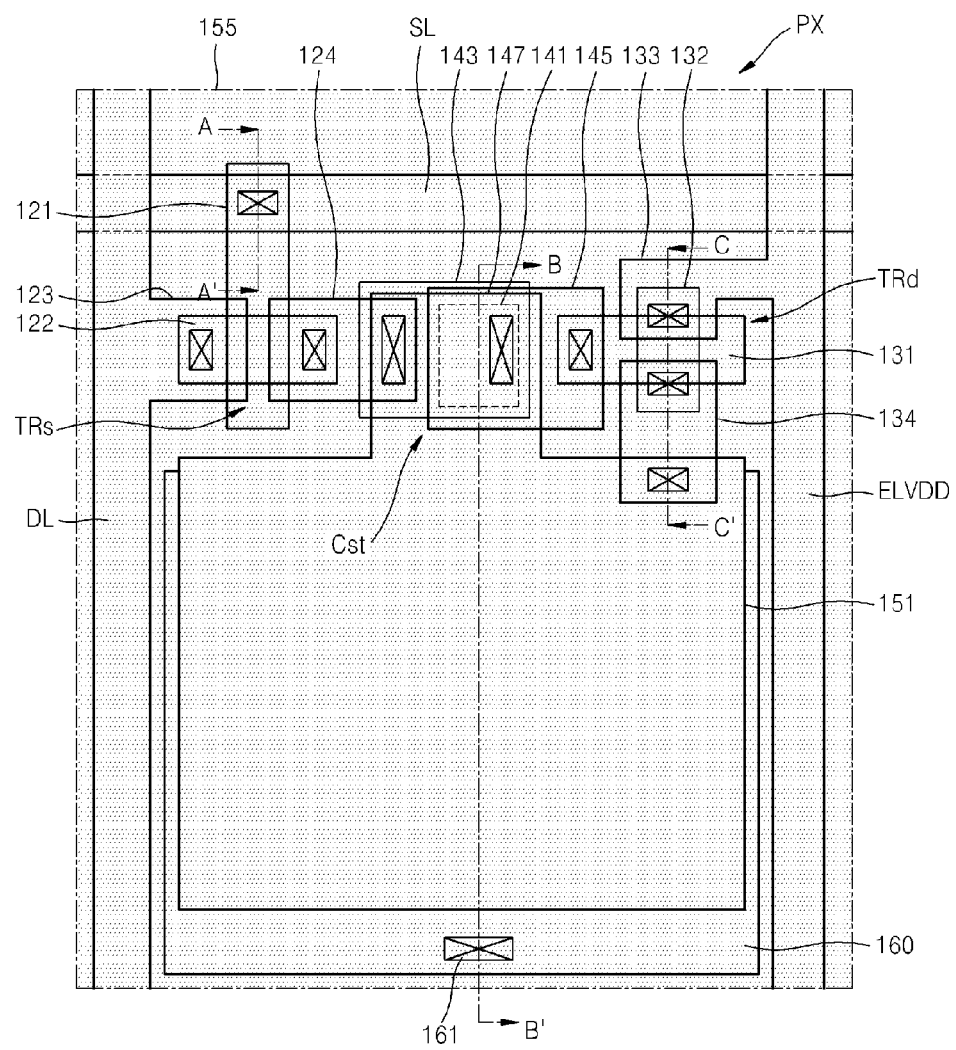
FIG. 1 is a plan view illustrating a single pixel of an organic light-emitting display device according to an embodiment of the present invention.

Hereinafter, the present invention will be described in detail by explaining preferred embodiments of the invention with reference to the attached drawings.

Like reference numerals in the drawings denote like elements. In the description of the present invention, certain detailed explanations of the related art are omitted when it is deemed that they may unnecessarily obscure the essence of the invention.

In the drawings, the lengths of layers and regions may be exaggerated for clarity. It will be understood that, when a layer, film, region, or plate is referred to as being "on" another layer, film, region, or plate, the layer, film, region, or plate can be directly on another layer, film, region, or plate or intervening layers, films, regions, or plates.

FIG. 1 is a plan view illustrating a single pixel of an organic light-emitting display device according to an embodiment of the present invention.

The organic light-emitting display device, according to an embodiment of the present invention includes a plurality of scanning lines SL and a plurality of data lines DL on a substrate, and a plurality of pixels PX which are placed at an area in which the scanning lines SL and the data lines DL cross each other. Referring to FIG. 1, each pixel PX includes an OLED and a driving circuit unit for displaying colors which correspond to data signals. The driving circuit unit includes a driving transistor TRd for supplying a driving current according to a data signal, a switching transistor TRs for turning the driving transistor TRd on or off by transmitting a data signal according to a scanning signal, and a storage capacitor Cst for storing a voltage which corresponds to a data signal. The pixel PX may further include a plurality of thin-film transistors (TFTs) and capacitors respectively for compensating for a threshold voltage of the driving transistor TRd.

The scanning lines SL are disposed in one direction on the substrate, and the data lines DL and a driving voltage supply line ELVDD are disposed to face each other in a direction perpendicular to the scanning lines SL.

The switching transistor TRs includes a gate electrode 121 which is disposed on the scanning lines SL, an active layer 122 which is disposed on the gate electrode 121, and source and drain electrodes 123 and 124, respectively, which are electrically connected to both ends of the active layer 122 through a contact hole. An insulating layer (not shown) is disposed between the gate electrode 121 and the scanning lines SL. The gate electrode 121 contacts the scanning lines SL through a contact hole, and is electrically connected to the scanning lines SL. One of the source and drain electrodes 123 and 124, respectively, is electrically connected to the data lines DS. Another one of the source and drain electrodes 123 and 124, respectively, is electrically connected to a second capacitor electrode 143 of the capacitor Cst through a contact hole. The one of the source and drain electrodes 123 and 124, respectively, electrically connected to the data lines DS may extend from the data lines DL and be formed as one body.

The driving transistor TRd includes a gate electrode 131 which is disposed on the driving voltage supply line ELVDD, an active layer 132 which is disposed on the gate electrode 131, and source and drain electrodes 133 and 134, respectively, which are electrically connected to both ends of the active layer 132 through a contact hole. The gate electrode 131 is electrically connected to a third capacitor electrode 145 of the capacitor Cst through a contact hole. One of the source and drain electrodes 133 and 134, respectively, is electrically connected to the driving voltage supply line ELVDD. Another one of the source and drain electrodes 133 and 134, respectively, is electrically connected to a pixel electrode of an OLED through a contact hole. The one of the source and drain electrodes 133 and 134, respectively, electrically connected to the driving voltage supply line ELVDD may extend from the driving voltage supply line ELVDD and be formed as one body.

The capacitor Cst includes a first capacitor electrode 141 which is disposed on the same layer as the scanning lines SL, the second capacitor electrode 143 which is disposed on the first capacitor electrode 141 and formed on the same layer as the gate electrodes 121 and 131, the third capacitor electrode 145 which is disposed on the second capacitor electrode 143 and formed on the same layer as the source and drain electrodes 123 and 124, respectively, and 133 and 134, respectively, and a fourth capacitor electrode 147 which is disposed on the third capacitor electrode 145 and formed on the same layer as an pixel electrode 151 of the OLED. The first and third capacitor electrodes 141 and 145, respectively, are electrically connected to each other through a contact hole. The fourth capacitor electrode 147 may extend from the pixel electrode 151 and may be formed as one body.

An auxiliary electrode 160 is formed of the same material, and on the same layer, as the scanning lines SL. It is desirable to form the auxiliary electrode 160 at an optimum location according to disposition of the scanning lines SL of the pixel PX, the TFT TRs and TRd, the capacitor Cst, the data lines DL, and the driving voltage supply line ELVDD. The auxiliary electrode 160 has high design freedom, as it is disposed under the driving circuit unit and the OLED. For example, in an embodiment of the present invention, the auxiliary electrode 160 may be formed not to overlap with the driving circuit unit but to partially overlap with the OLED. Additionally, the auxiliary electrode 160 is disposed not to overlap with the data lines DL and the driving voltage supply line ELVDD, thus preventing a parasitic capacitance from being generated between the data lines DL and the driving voltage supply line ELVDD. The auxiliary electrode 160 has a shape and size similar to that of the pixel electrode 151. Referring to FIG. 1, the pixel electrode 151 and the auxiliary electrode 160 are shown in a rectangular shape, but are not limited thereto. The pixel electrode 151 and the auxiliary electrode 160 may have various shapes such as a shape with round edges, or a cylindrical shape, according to a shape of the pixel PX. The auxiliary electrode 160 contacts an opposite electrode or a cathode electrode 155 through a contact hole 161 which is formed near the pixel electrode 151. Accordingly, the auxiliary electrode 160 is electrically connected to the cathode electrode 155, and may function as an auxiliary electrode of the cathode electrode 155, thus minimizing a voltage drop of the cathode electrode 155. Therefore, according to an embodiment of the present invention, unevenness of brightness in the display device may be reduced.

FIGS. 2 through 11 are cross-sectional views, taken along lines A-A', B-B', and C-C' of FIG. 1, for explaining a method of manufacturing an OLED display device according to an embodiment of the present invention.

Figure 2:
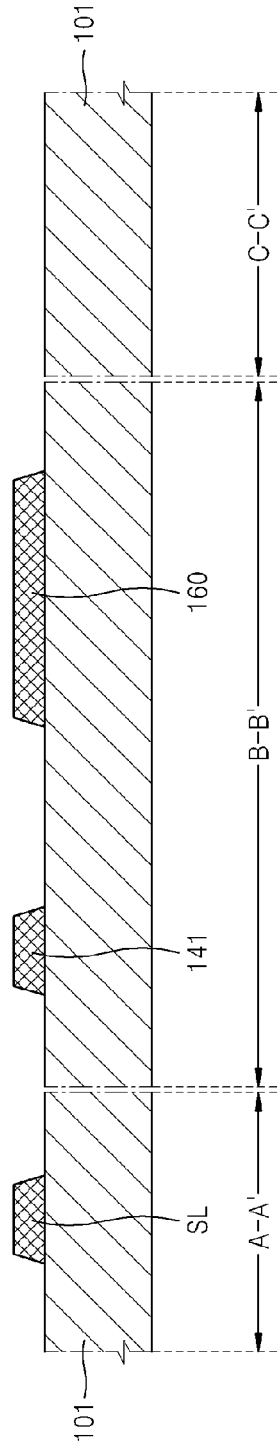

Referring to FIG. 2, the scanning lines SL, the first capacitor electrode 141 of the capacitor Cst, and the auxiliary electrode 160 are formed on the substrate 101.

The substrate 101 may be formed of transparent glass having silicon dioxide ($SiO_2$) as a main component. However, the substrate 101 is not limited thereto, and may be formed of various materials such as transparent plastic, metal, and the like.

A buffer layer (not illustrated) may be further formed on the substrate 101. The buffer layer functions as a barrier layer and/or a blocking layer to prevent spread of impurity ions, prevent inflow of moisture or external air, and planarize a surface. The buffer layer may be formed of $SiO_2$ and/or silicon nitride ($SiN_x$) by using various deposition methods such as plasma-enhanced chemical vapor deposition (PECVD), atmospheric pressure chemical vapor deposition (APCVD), low pressure CVD (LPCVD), and the like.

The scanning lines SL, the first capacitor electrode 141, and the auxiliary electrode 160 may be simultaneously formed by stacking a first conductive layer on the substrate 101 and patterning the first conductive layer. The first conductive layer may be formed of single or multiple layers by using at least one material selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). Desirably, the first conductive layer may include low-resistance metal such as Al and Cu. However, the first conductive layer may also include other metal that may be formed in single or multiple layers with sufficient thicknesses.

Figure 3:
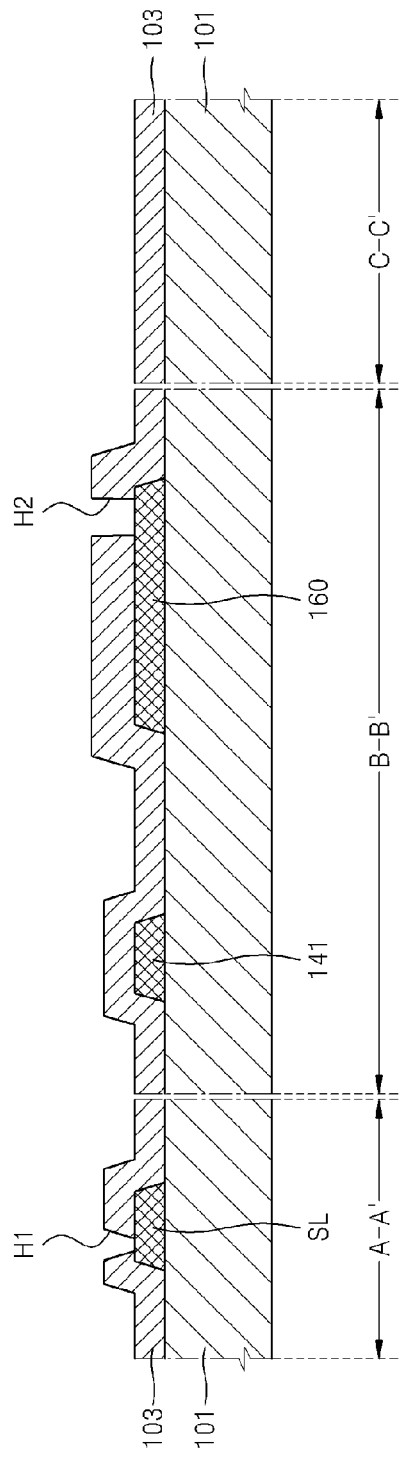

Then, as illustrated in FIG. 3, an insulating layer 103 is formed on the substrate 101. Additionally, holes H1 and H2 are formed in the first insulating layer 103 on top of the scanning lines SL and the auxiliary electrode 160. The first hole H1 is a contact hole for exposing a part of the scanning lines SL, and for later connecting the scanning lines SL to the gate electrode 121 of the switching transistor TRs. The second hole H2 is a contact hole for exposing a part of the auxiliary electrode 160, and for later connecting the auxiliary electrode 160 to the cathode electrode 155. The second holes H2 are located nearby the pixel electrode 151.

The first insulating layer 103 may be formed of at least one organic insulating material selected from the group consisting of polyimide, polyamide, acryl resin, benzo-cyclo-butene (BCB), and phenolic resin, or an inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$. Additionally, the first insulating layer 103 may be formed in a structure of multiple layers in which the organic insulating material and the inorganic insulating material are alternately used.

As illustrated in FIG. 4, the gate electrode 131 of the driving transistor TRd, the gate electrode 121 of the switching transistor TRs, and the second capacitor electrode 143 of the capacitor Cst are formed on the first insulating layer 103. The gate electrode 121 of the switching transistor TRs partially overlaps with the scanning lines SL and covers the first hole H1, and is connected to the scanning line SL. The second capacitor electrode 143 partially overlaps with the first capacitor electrode 141.

The gate electrodes 121 and 131, and the second capacitor electrode 143 may be simultaneously formed by stacking a second conductive layer on the first insulating layer 103 and patterning the second conductive layer.

The second conductive layer may be formed of single or multiple layers by using at least one material selected from among Al, Pt, Pd, Ag, Mg, Au, Ni, Nd, Ir, Cr, Li, Ca, Mo, Ti, W, and Cu. Additionally, the second conductive layer may also include at least one material selected from the group consisting of transparent conductive materials such as indium tin oxide (ITO), indium zinc oxide (IZO), zinc oxide (ZnO), indium oxide ($In_2O_3$), indium gallium oxide (IGO), and aluminum zinc oxide (AZO). A thickness d2 of the second conductive layer is less than a thickness d1 of the first conductive layer. Therefore, the thickness d2 of the gate electrodes 121 and 131 is smaller than the thickness d1 of the scanning lines SL.

Referring to FIG. 5, a second insulating layer 104 is deposited on the gate electrodes 121 and 131, and the active layer 132 of the driving transistor TRd is formed on the second insulating layer 104. Although not illustrated in FIG. 5, the active layer 122 of the switching transistor TRs (FIG. 1) is also formed simultaneously with the active layer 132.

The active layers 122 and 132 are formed by depositing the second insulating layer 104 (FIG. 5) and an oxide semiconductor material on the substrate 101, on which the gate electrodes 121 and 131 and the capacitor electrode 141 are formed, and patterning the oxide semiconductor material.

The second insulating layer 104 functions as a gate insulating layer. The second insulating layer 104 may be formed of an inorganic insulating material such as SiNx or SiOx, as well as an organic insulating material. According to an embodiment of the present invention, the scanning lines SL formed by the first conductive layer and the gate electrode 131 formed by the second conductive layer are formed separately from each other. Accordingly, as the gate electrode 131 is separated from the scanning lines SL which are low-resistance wiring, the gate electrode 131 may be formed to have less thickness than the scanning lines SL. Therefore, the second insulating layer 104 may be formed in a small thickness, and a size of the TFT may be reduced.

The active layers 122 and 132 of FIG. 1 each provide channel, source, and drain areas, and are disposed so that the channel area overlaps with the gate electrodes 121 and 131.

The TFT, which includes an oxide semiconductor, has excellent element characteristics and allows a low-temperature process. Thus, the element is considered as optimum for a backplane for a flat-panel display device. Furthermore, as the TFT, which includes an oxide semiconductor, has flexible as well as transparent characteristics in an area of visible ray, the TFT may be applied to a transparent display device or a flexible display device. The oxide semiconductor material may include at least one selected from the group consisting of gallium (Ga), indium (In), stanium (Sn), zirconium (Zr), hafnium (Hf), vanadium (V), and a combination thereof. For example, the oxide semiconductor may include at least one selected from the group consisting of ZnO, $SnO_2$, $In_2O_3$, $Zn_2SnO_4$, $Ga_2O_3$ and $HfO_2$. Additionally, the active layers 122 and 132 may be formed of a transparent oxide semiconductor. The transparent oxide semiconductor may include, for example, zinc oxide, tin oxide, Ga—In—Zn oxide, In—Zn oxide, and In—Sn oxide, but is not limited thereto.

Figure 6:
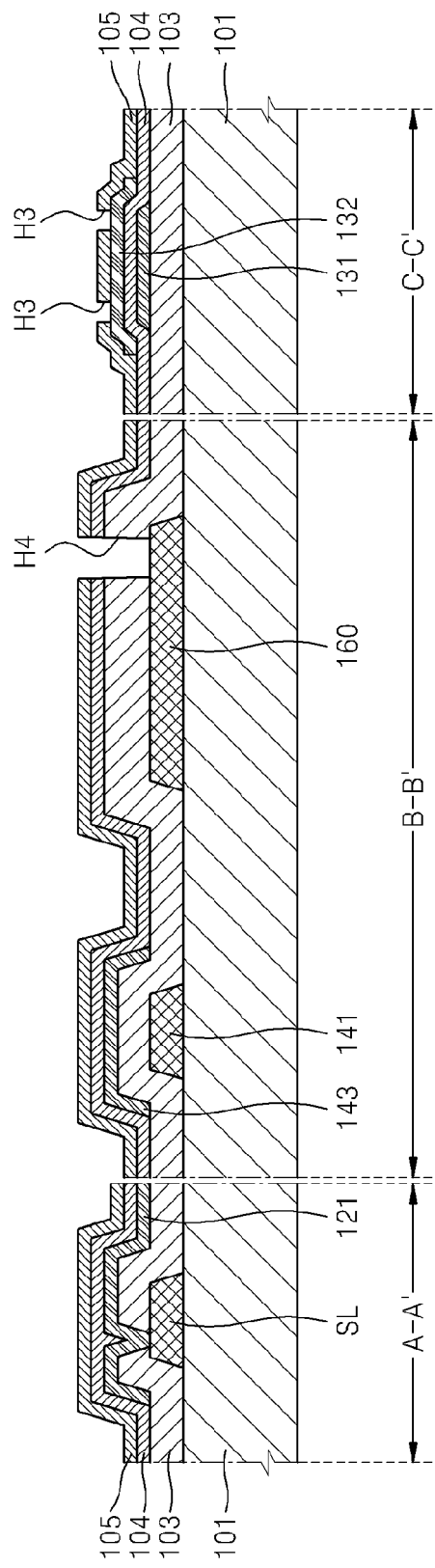

On the active layers 122 and 132 of FIG. 1, referring to FIG. 6, a third insulating layer 105 is deposited, and a third hole H3, for exposing a part of the source and drain areas on the active layers 122 and 132, and a fourth hole H4, which corresponds to the second hole H2 (FIG. 4) formed on the first insulating layer 103 on the auxiliary electrode 160, are formed. The fourth hole H4 is formed by etching the second insulating layer 104 and the third insulating layer 105 simultaneously, when the third hole H3 is formed by etching the third insulating layer 105. The auxiliary electrode 160 is partially exposed through the fourth hole H4.

The third insulating layer 105 functions as an interlayer insulating layer, and may be formed of an insulating inorganic material such as SiNx or SiOx. Besides, the third insulating layer 105 may also formed of as an organic insulating material.

Figure 7:
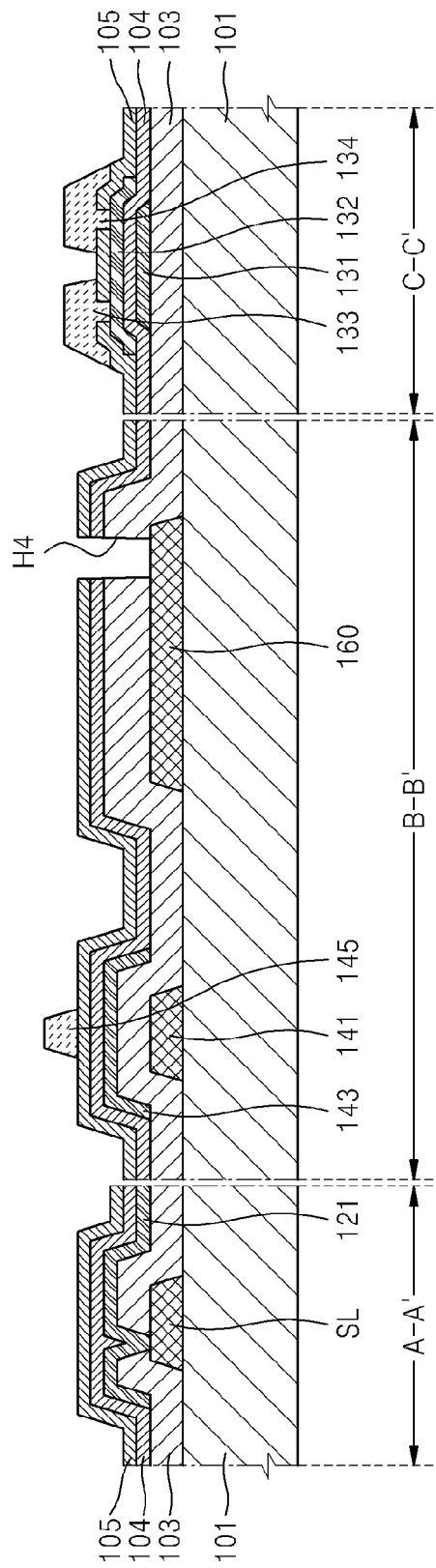

Then, referring to FIG. 7, the source electrode 133 and the drain electrode 134 on the driving transistor TRd, and the third capacitor electrode 145 on the capacitor Cst are formed. Although not illustrated in FIG. 5, the source electrode 123 and the drain electrode 124 of the switching transistor TRs are also formed simultaneously.

The source electrodes 123 and 133 and the drain electrodes 124 and 134 may be formed of single or multiple layers by burying holes H3 (FIG. 6) on the third insulating layer 105. The source electrodes 123 and 133 and the drain electrodes 124 and 134 contact the source and drain areas, respectively, on the active layer 122 and 132 through the holes H3. The source electrodes 123 and 133 and the drain electrodes 124 and 134 may be formed of a conductive material. For example, the source electrodes 123 and 133 and the drain electrodes 124 and 134 may be formed by patterning a third conductive layer which includes metal such as Cr, Pt, Ru, Au, Ag, Mo, Al, W, Cu, or AlNd, or metal or a conductive oxide such as ITO, GIZO, GZO, AZO, IZO(InZnO), or AZO (AlZnO).

Additionally, the third conductive layer is patterned simultaneously with patterning of the source electrodes 123 and 133 and the drain electrodes 124 and 134, thus forming the third capacitor electrode 145 of the capacitor Cst.

Although not illustrated in FIG. 7, the data lines DL and the driving voltage supply line ELVDD may be formed simultaneously with formation of the source electrodes 123 and 133, the drain electrodes 124 and 134, and the third capacitor electrode 145.

Figure 8:
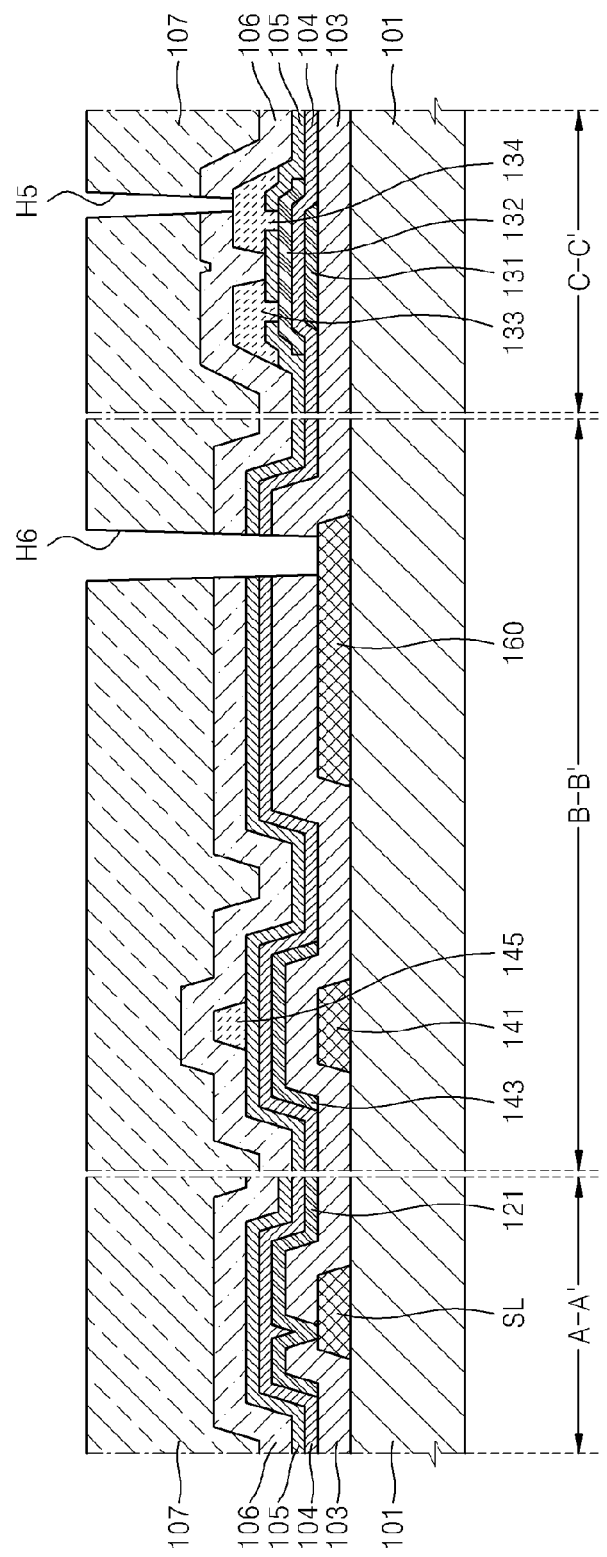

Then, referring to FIG. 8, a fourth insulating layer 106 and a fifth insulating layer 107 are deposited on the substrate 101 on which the source electrodes 123 and 133, the drain electrodes 124 and 134, and the third capacitor electrode 145 are formed. Additionally, by etching the fourth insulating layer 106 and the fifth insulating layer 107, a fifth hole H5 for exposing a part of the drain electrode 134 of the driving transistor TRs and a sixth hole H6 for exposing a part of the auxiliary electrode 160 are formed. The sixth hole H6 is formed on a region which corresponds to the second hole H2 (FIG. 4) and the fourth hole H4 (FIG. 6).

The fourth insulating layer 106 and the fifth insulating layer 107 may be formed by using at least one organic insulating material selected from the group consisting of polyimide, polyamide, acryl resin, benzo-cyclo-butene (BCB), and phenolic resin, by using an inorganic insulating material such as SiNx, or by alternately using the organic insulating material and the inorganic insulating material. The fourth insulating layer 106 and the fifth insulating layer 107 may be formed in various structures such as single, double, or multiple layers. The fifth insulating layer 107 functions as a planarization layer.

Figure 9:
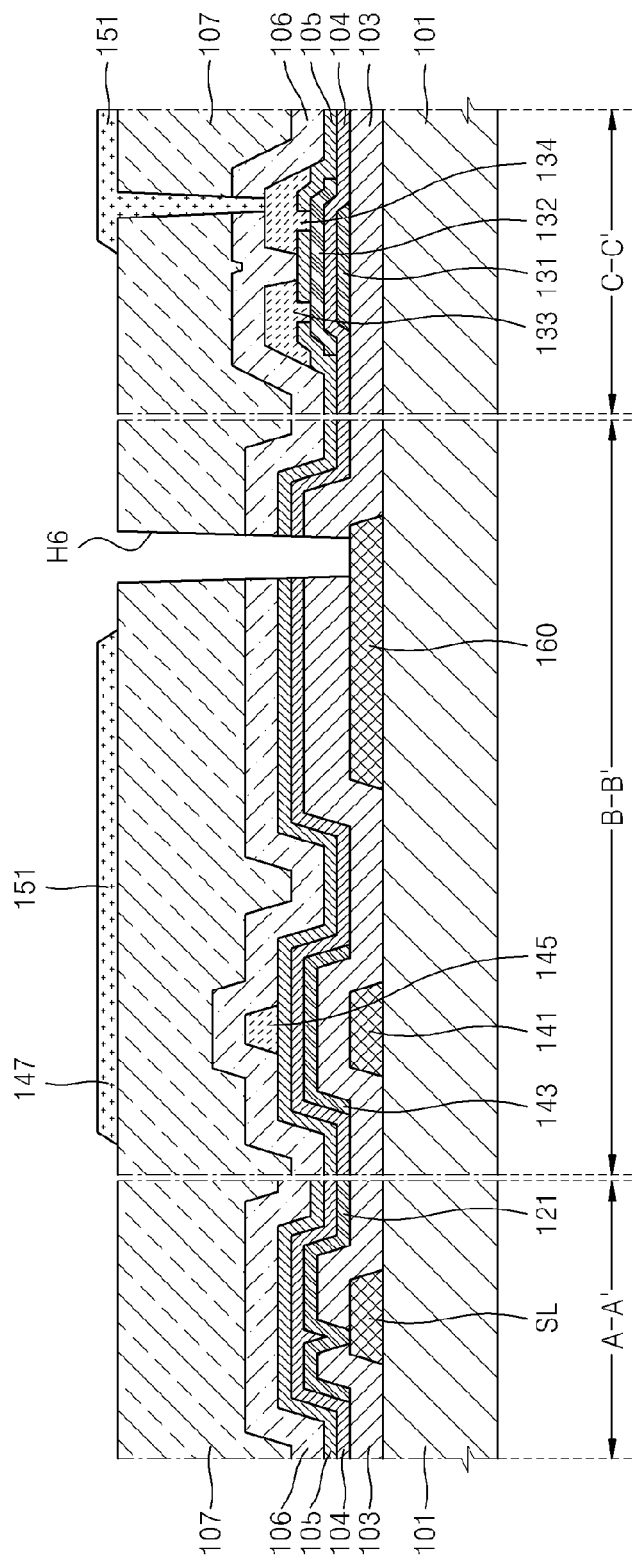

Then, as illustrated in FIG. 9, the pixel electrode 151 of the OLED and the fourth capacitor 147 of the capacitor Cst are formed on the fifth insulating layer 107.

The pixel electrode 151 is formed by depositing a transparent conductive layer on the fifth insulating layer 107 and patterning the transparent conductive layer. The transparent conductive layer may include at least one material selected from the group consisting of ITO, IZO, ZnO, $In_2O_3$, IGO, and AZO.

The pixel electrode 151 contacts either of the source electrode 133 or the drain electrode 134 of the driving transistor TRd, through the fifth hole H5 on the fifth insulating layer 107. In an embodiment shown in FIG. 9, the pixel electrode 151 contacts the drain electrode 134.

The fourth capacitor electrode 147 of the capacitor Cst may be formed to extend from the pixel electrode 151.

Figure 10:
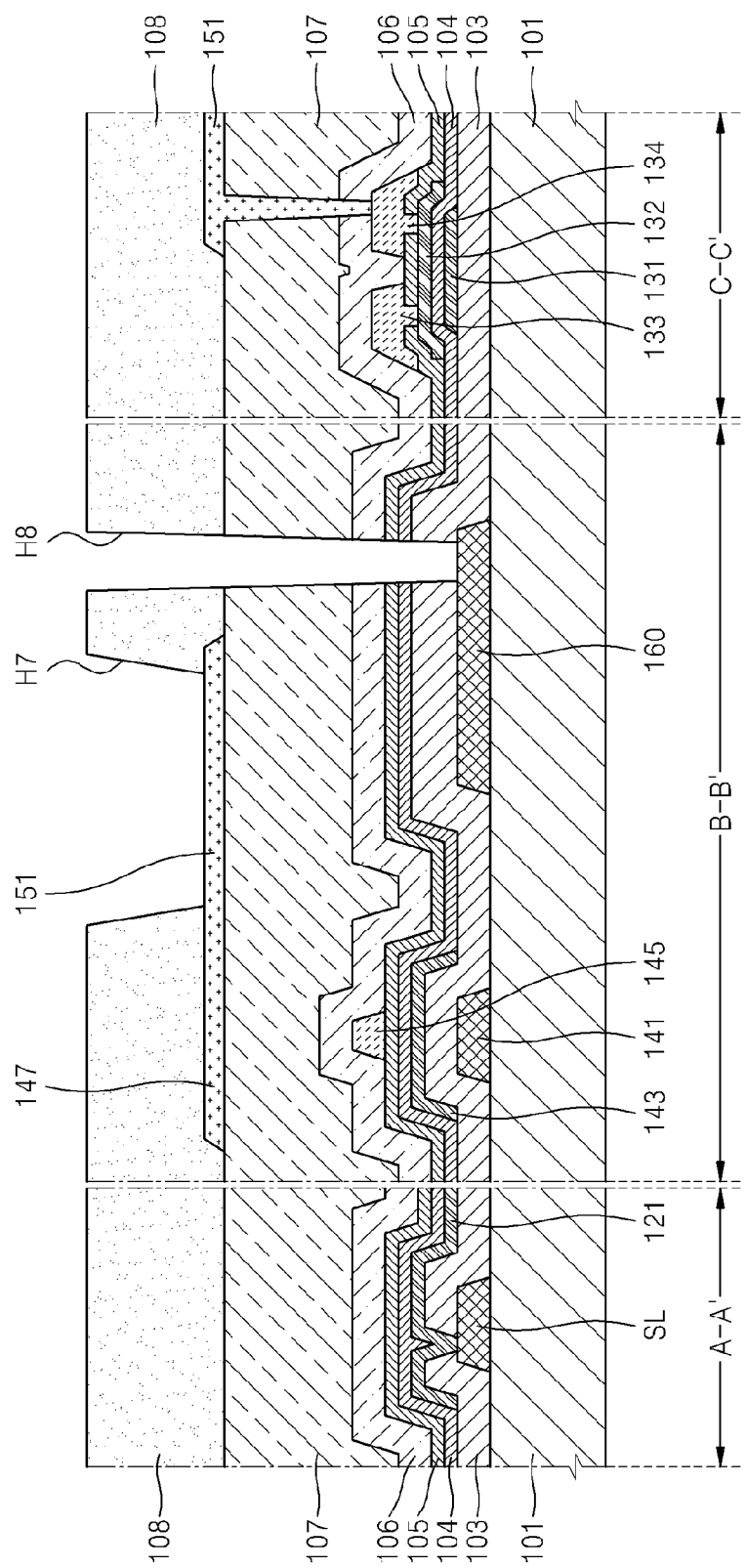

Referring to FIG. 10, a sixth insulating layer 108 is deposited on the pixel electrode 151 and the fourth capacitor 147, and a seventh hole H7 for exposing a part of the pixel electrode 151 and a eighth hole H8 for exposing a part of the auxiliary electrode 160 are formed. The eighth hole H8 is formed on a region which corresponds to the second, fourth, and sixth holes H2 (FIG. 4), H4 (FIG. 7), and H6 (FIG. 9).

The sixth insulating layer 108 may be formed of at least one organic insulating material selected from the group consisting of polyimide, polyamide, acryl resin, benzo-cyclo-butene (BCB), and phenolic resin, or an inorganic insulating material selected from the group consisting of $SiO_2$, SiNx, $Al_2O_3$, CuOx, $Tb_4O_7$, $Y_2O_3$, $Nb_2O_5$, and $Pr_2O_3$. Additionally, the sixth insulating layer 108 may be formed in a structure of multiple layers in which the organic insulating material and the inorganic insulating material are alternately used. The sixth insulating layer 108 functions as a pixel-defining layer which defines a pixel.

Figure 11:
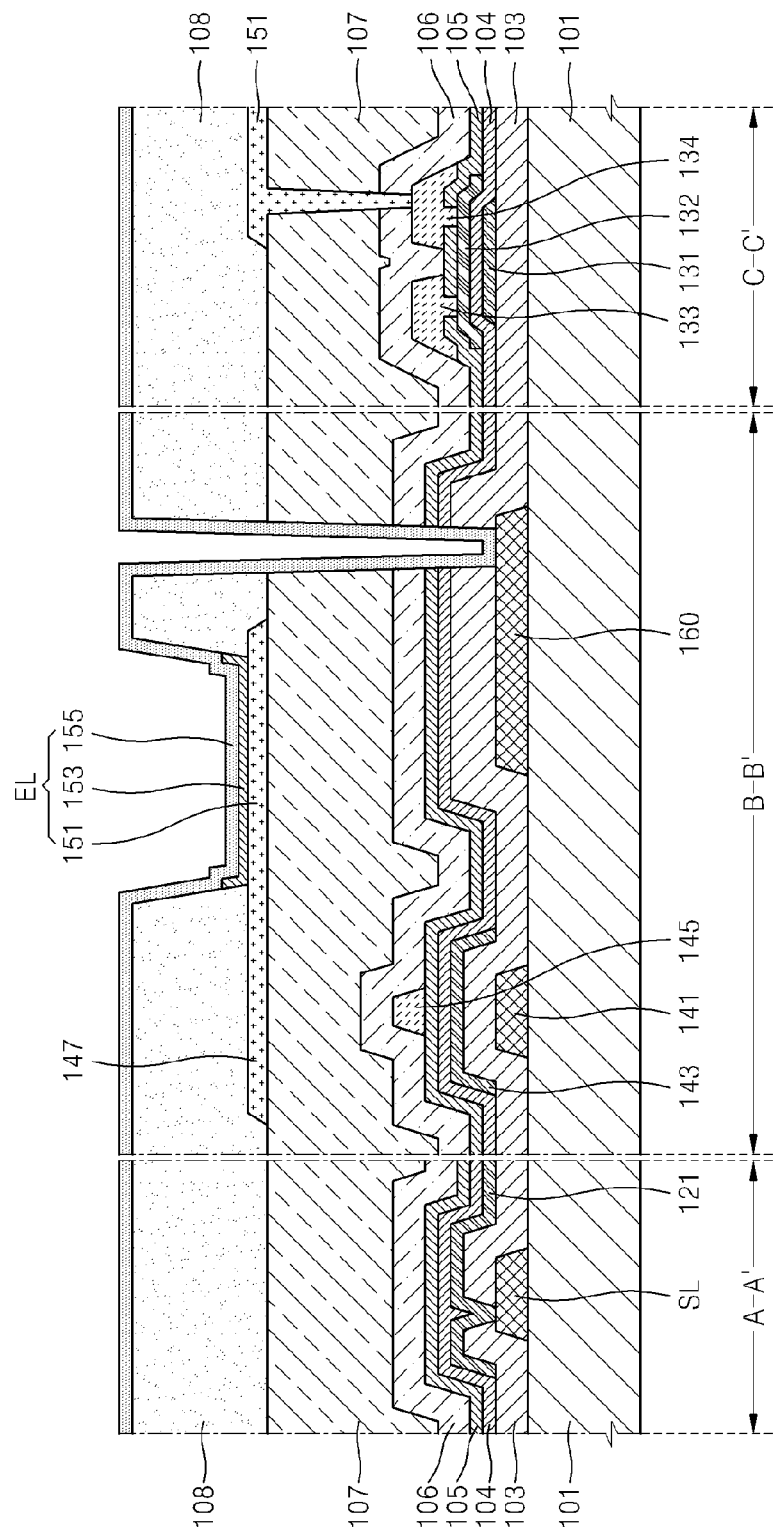

Then, as illustrated in FIG. 11, an intermediate layer 153, which includes an emissive layer, is formed on the pixel electrode 151, and the opposite electrode 155 is formed on an entire surface of the substrate 101 so as to cover the intermediate layer 153.

The intermediate layer 153 may be formed of stacking at least one selected from among function layers such as an emissive layer (EML), a hole transport layer (HTL), a hole injection layer (HIL), a hole injection layer (HIL), an electron transport layer (ETL), and an electron injection layer (EIL) in single or multiple structure. The intermediate layer 153 may be formed of a low-molecular weight organic material or a polymer organic material. If the intermediate layer 153 emits red, green, or blue light, the emissive layer may be patterned into a red, green, or blue emissive layer respectively according to red, green, and blue sub-pixels. If the intermediate layer 153 emits white light, the emissive layer may have a multi-layered structure formed by stacking red, green, and blue emissive layers, or have a single-layered structure which includes red, green, and blue light-emitting materials, in order to emit white light.

The opposite electrode 155 may be deposited on the entire surface of the substrate 101 and may be formed as a common electrode. In the case of the organic light-emitting display device according to an embodiment of the present invention, the pixel electrode 151 may be used as an anode electrode and the opposite electrode 155 may be used as a cathode electrode.

The opposite electrode 155 contacts, and is connected to, the auxiliary electrode 160 through the eighth hole H8. Accordingly, the auxiliary electrode receives a voltage from the opposite electrode 155, thus preventing a voltage drop of the cathode electrode.

According to an embodiment of the present invention, the scanning lines SL, which are formed of low-resistance wiring, and the gate electrode of the TFT are separately formed on different layers with an insulating layer therebetween. In this case, the gate electrode of the TFT may be formed so as to have relatively less thickness, compared to a case of forming both the scanning lines SL and the gate electrode of the TFT so as to have a low-resistance wiring. Thus, the gate insulating layer between the gate electrode and the active layer may also be formed so as to have less thickness. Therefore, a resistance-capacitance (RC) load on the scanning lines SL and a size of the TFT may be reduced, thus increasing an aperture ratio of a pixel. Additionally, the capacitor Cst may be formed of a triple capacitor with first through fourth capacitor electrodes, thus increasing capacitance while reducing the size of the capacitor.

Additionally, according to an embodiment of the present invention, a cathode auxiliary electrode is formed of the same material, and on the same layer, as the scanning lines SL which is formed of the low-resistance wiring on the lowest layer. Thus, a limit of disposition of the auxiliary electrode may be minimized. Therefore, the cathode auxiliary electrode may be formed in various sizes, and a voltage drop of the cathode electrode may be minimized by using the cathode auxiliary electrode.

In the current embodiment, an organic light-emitting display device is described as an example. However, the present invention is not limited thereto, and may be applied to various display devices, such as a liquid crystal display (LCD) device, by separating scanning lines from a gate electrode of the TFT, and by forming an electrode of the capacitor and a cathode auxiliary electrode by using a wiring, which forms the scanning lines.

Embodiments of the present invention are not limited to the pixel structure described above. The present invention may be applied to various display devices in which a cathode auxiliary electrode may be formed under a driving circuit unit and a light-emitting diode.

The present invention may improve design freedom of an auxiliary electrode by forming the auxiliary electrode of the cathode on the same layer as the scanning lines of the lowest layer. Additionally, a voltage drop of the cathode may be minimized by using the auxiliary electrode in order to provide a display device which has even brightness.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device comprising:
a plurality of scanning lines; and
a plurality of pixels,
each pixel of the plurality of pixels comprises:
a first electrode formed from a same layer and in a same plane as the scanning lines, and the first electrode is formed of a same material as the scanning lines;
a plurality of insulating layers sequentially disposed on the first electrode, a contact hole is formed through the plurality of insulating layers to expose a part of a surface of the first electrode;
an organic light-emitting diode (OLED), which includes
a pixel electrode disposed on the plurality of insulating layers,
a second electrode facing the pixel electrode and contacting the first electrode through the contact hole, and
an organic emissive layer disposed between the pixel electrode and the second electrode; and
a driving circuit, which includes
a first thin-film transistor (TFT) including
a gate electrode disposed on one of the scanning lines,
an active layer on the gate electrode, and
source and drain electrodes which contact source and drain areas, respectively, of the active layer;
a second TFT; and
a capacitor including
a first capacitor electrode disposed on a same layer as the scanning lines,
a second capacitor electrode disposed on a same layer as the gate electrode of the second TFT, and
a third capacitor electrode disposed on a same layer as the source and drain electrodes of the second TFT.

2. The organic light-emitting display device of claim 1, wherein the active layer is formed of an oxide semiconductor.

3. The organic light-emitting display device of claim 1, wherein a thickness of the gate electrode is less than a thickness of the scanning lines.

4. The organic light-emitting display device of claim 1, wherein the gate electrode contacts the scanning line through a contact hole which is formed on an insulating layer on the scanning lines.

5. The organic light-emitting display device of claim 1, wherein the capacitor further comprises a fourth capacitor electrode which extends from the pixel electrode, and which is disposed on the third capacitor electrode.

6. The organic light-emitting display device of claim 1, wherein the first electrode overlaps a part of the pixel electrode and contacts the second electrode through the contact hole, which is formed near the pixel electrode.

7. The organic light-emitting display device of claim 1, wherein the first electrode functions as an auxiliary wiring of the second electrode.

8. The organic light-emitting display device of claim 1, wherein the first electrode does not overlap the driving circuit formed on the first electrode and does partially overlap the OLED.

9. An organic light-emitting display device, comprising:
a scanning line;
a first electrode formed from a same layer and in a same plane as the scanning line;
a driving circuit;
an OLED including a pixel electrode,
an organic emissive layer,
a second electrode; and
a plurality of insulating layers sequentially disposed on the first electrode,
wherein a second electrode is disposed on an uppermost insulating layer among the plurality of insulating layers, and contacts the first electrode through a contact hole formed through the plurality of insulating layers, and
the driving circuit comprises:
a first thin-film transistor (TFT) which includes
a gate electrode disposed on the scanning line,
an active layer on the gate electrode, and
source and drain electrodes which contact source and drain areas, respectively, of the active layer,
a second TFT, and
a capacitor which includes a first capacitor electrode formed of a same layer as the scanning lines,
a second capacitor electrode formed of a same layer as a gate electrode of the second TFT, and
a third capacitor electrode formed of a same layer as source and drain electrodes of the second TFT.

10. The organic light-emitting display device of claim 9, wherein the first electrode is formed of a same material, from a same layer, and in a same plane as the scanning line.

11. The organic light-emitting display device of claim 9, wherein the first electrode overlaps a part of the pixel electrode, and the contact hole is formed near the pixel electrode.

12. The organic light-emitting display device of claim 9, wherein the first electrode functions as an auxiliary wiring of the second electrode.

13. The organic light-emitting display device of claim 9, wherein the first electrode does not overlap the driving circuit and does partially overlap the OLED.

14. The organic light-emitting display device of claim 9, wherein the capacitor further comprises fourth capacitor electrode which extends from the pixel electrode, and which is disposed on the third capacitor electrode.

* * * * *